(12) United States Patent
Wakabayashi

(10) Patent No.: US 11,482,375 B2
(45) Date of Patent: Oct. 25, 2022

(54) COIL COMPONENT AND ELECTRONIC DEVICE

(71) Applicant: TAIYO YUDEN CO., LTD., Tokyo (JP)

(72) Inventor: Hirotaka Wakabayashi, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 723 days.

(21) Appl. No.: 16/255,589

(22) Filed: Jan. 23, 2019

(65) Prior Publication Data

US 2019/0237246 A1 Aug. 1, 2019

(30) Foreign Application Priority Data

Jan. 31, 2018 (JP) .............................. JP2018-015920

(51) Int. Cl.

| | |
|---|---|
| *H01F 27/29* | (2006.01) |
| *H01F 27/28* | (2006.01) |
| *H05K 1/11* | (2006.01) |
| *H05K 1/18* | (2006.01) |
| *H01F 17/04* | (2006.01) |

(52) U.S. Cl.
CPC ........... *H01F 27/292* (2013.01); *H01F 17/04* (2013.01); *H01F 27/2804* (2013.01); *H05K 1/11* (2013.01); *H05K 1/181* (2013.01); *H01F 2017/048* (2013.01); *H01F 2027/2809* (2013.01); *H05K 2201/1003* (2013.01)

(58) Field of Classification Search
CPC .................................................. H01F 27/292

USPC .......................................................... 336/200
See application file for complete search history.

(56) References Cited

U.S. PATENT DOCUMENTS

| | | | |
|---|---|---|---|
| 2016/0172096 A1* | 6/2016 | Jeong ..................... | H01F 27/292 336/200 |
| 2017/0127521 A1* | 5/2017 | You ......................... | H05K 1/111 |
| 2018/0234074 A1* | 8/2018 | Lee ......................... | H01F 27/292 |
| 2019/0066911 A1* | 2/2019 | Hashimoto ............ | H05K 1/0271 |
| 2019/0387630 A1* | 12/2019 | Belman ................. | H05K 3/3442 |

FOREIGN PATENT DOCUMENTS

| | | |
|---|---|---|
| JP | 2005116708 A | 4/2005 |
| JP | 2016058418 A | 4/2016 |

* cited by examiner

*Primary Examiner* — Stanley Tso
(74) *Attorney, Agent, or Firm* — Law Office of Katsuhiro Arai

(57) ABSTRACT

In an exemplary embodiment, a coil component includes: an element body part 10 including a magnetic material; a coil 30 built into the element body part 10; an external electrode 50a electrically connected to the coil 30 and provided at least on a bottom face 12 of the element body part 10 along a side 13a of the bottom face 12; and an external electrode 50b electrically connected to the coil 30 and provided at least on the bottom face 12 along a side 13b, opposite the side 13a, of the bottom face 12; wherein the external electrode 50a has a tip part 52a facing the external electrode 50b; the external electrode 50b has a tip part 52b facing the external electrode 50a; and a void 70a is formed between the external electrode 50a and the bottom face 12 in a manner extending from the tip part 52a.

10 Claims, 8 Drawing Sheets

COIL COMPONENT AND ELECTRONIC DEVICE

BACKGROUND

Field of the Invention

The present invention relates to a coil component and an electronic device.

Description of the Related Art

Coil components, each comprising a coil built into an element body part as well as external electrodes provided on the surface of the element body part and electrically connected to the coil, are known (Patent Literatures 1 and 2, for example).

BACKGROUND ART LITERATURES

[Patent Literature 1] Japanese Patent Laid-open No. 2005-116708
[Patent Literature 2] Japanese Patent Laid-open No. 2016-58418

SUMMARY

A coil component is mounted on a circuit board by soldering or the like, or otherwise joining the external electrodes of the coil component to the terminal electrodes on the circuit board. The circuit board may deflect due to temperature shift, etc. If the circuit board deflects, stress is applied to the external electrodes of the coil component being joined to the terminal electrodes of the circuit board, and cracks may generate in the coil component as a result.

The present invention was developed in light of the aforementioned problem, and its object is to prevent such cracks from generating.

Any discussion of problems and solutions involved in the related art has been included in this disclosure solely for the purposes of providing a context for the present invention, and should not be taken as an admission that any or all of the discussion were known at the time the invention was made.

The present invention is a coil component comprising: an element body part which is formed by materials that include a magnetic material; a coil which is built into the element body part and formed by a conductor; a first external electrode which is provided at least on a first face, among all surfaces, of the element body part at a position closer to a first side edge of the first face, and which is electrically connected to the coil; and a second external electrode which is provided at least on the first face, among all surfaces, of the element body part at a position closer to a second side edge, opposite the first side edge, of the first face, and which is electrically connected to the coil; wherein the first external electrode has a first tip part facing the second external electrode on the first face of the element body part; the second external electrode has a second tip part facing the first external electrode on the first face of the element body part; and a first void is formed between the first external electrode and the first face of the element body part, in a manner extending from the first tip part of the first external electrode.

The aforementioned constitution may be such that a second void is formed between the second external electrode and the first face of the element body part, in a manner extending from the second tip part of the second external electrode.

The aforementioned constitution may be such that: the coil has a first lead conductor and a second lead conductor, both led out from the coil; the first external electrode is provided in a manner extending from the first face, to a second face that connects to the first face along the first side edge of the first face, of the element body part; the second external electrode is provided in a manner extending from the first face, to a third face that connects to the first face along the second side edge of the first face, of the element body part; the first lead conductor is led out from the coil toward the second face of the element body part and connected to the first external electrode on the second face of the element body part; and the second lead conductor is led out from the coil toward the third face of the element body part and connected to the second external electrode on the third face of the element body part.

The aforementioned constitution may be such that the first lead conductor, and the second lead conductor, are each provided at a position closer to a fourth face, than the center between the first face and the fourth face opposite the first face, of the element body part.

The aforementioned constitution may be such that the end of the first void opposite the first tip part of the first external electrode, is positioned closer to the first side edge of the first face of the element body part than is a projected area obtained by projecting the coil onto the first face of the element body part.

The aforementioned constitution may be such that: the first external electrode is provided in a manner extending from the first face, via a second face that connects to the first face along the first side edge of the first face, to a fourth face opposite the first face, of the element body part; the second external electrode is provided in a manner extending from the first face, via a third face that connects to the first face along the second side edge of the first face, to the fourth face opposite the first face, of the element body part; the first external electrode has a third tip part facing the second external electrode on the fourth face of the element body part; the second external electrode has a fourth tip part facing the first external electrode on the fourth face of the element body part; and a third void is formed between the first external electrode and the fourth face of the element body part, in a manner extending from the third tip part of the first external electrode.

The aforementioned constitution may be such that the maximum height of the first void is 10 µm or smaller.

The present invention is an electronic device comprising: a coil component according to the foregoing; and a circuit board on which the coil component is mounted; wherein the first external electrode, and the second external electrode, of the coil component, are each connected to a terminal electrode on the circuit board.

According to the present invention, generation of cracks can be prevented.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 1A is a perspective view of the coil component, while

FIG. 2A is a bottom view of the coil component pertaining to Example 1, while

FIG. 8A is a cross-sectional view of the coil component pertaining to Example 4, while

DESCRIPTION OF THE SYMBOLS

Figure 1A:
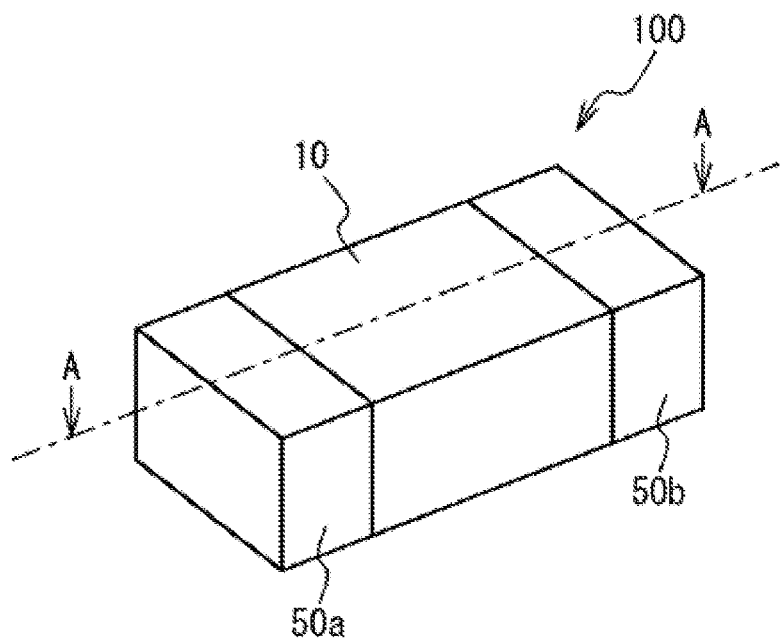

10 Element body part
12 Bottom face
13a, 13b Side edge
14 Top face
15a, 15b Side edge
17 Center
16, 18 End face
20, 22 Side face
24 Magnetic metal grain
26 Resin
30 Coil
34a, 34b Lead conductor
36 Projected area
50a, 50b External electrode
52a, 52b Tip part
54a, 54b Tip part
56a, 56b Joining part
58 First layer
60 Second layer
62 Third layer
70a, 70b Void
71a, 71b End
72a, 72b Void
73a, 73b End
80 Crack
90 Circuit board
92 Terminal electrode
94 Solder
100 to 410 Coil component
500 Electronic device
1000 Coil component

DETAILED DESCRIPTION OF EMBODIMENTS

Examples of the present invention are explained below by referring to the drawings.

EXAMPLE 1

Figure 1B:
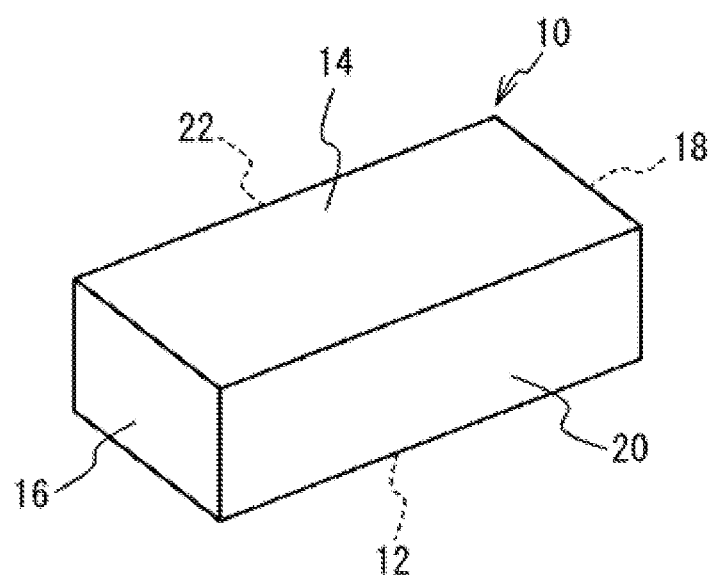
FIG. 1B is a perspective view of the element body part, pertaining to Example 1.
Figure 2A:
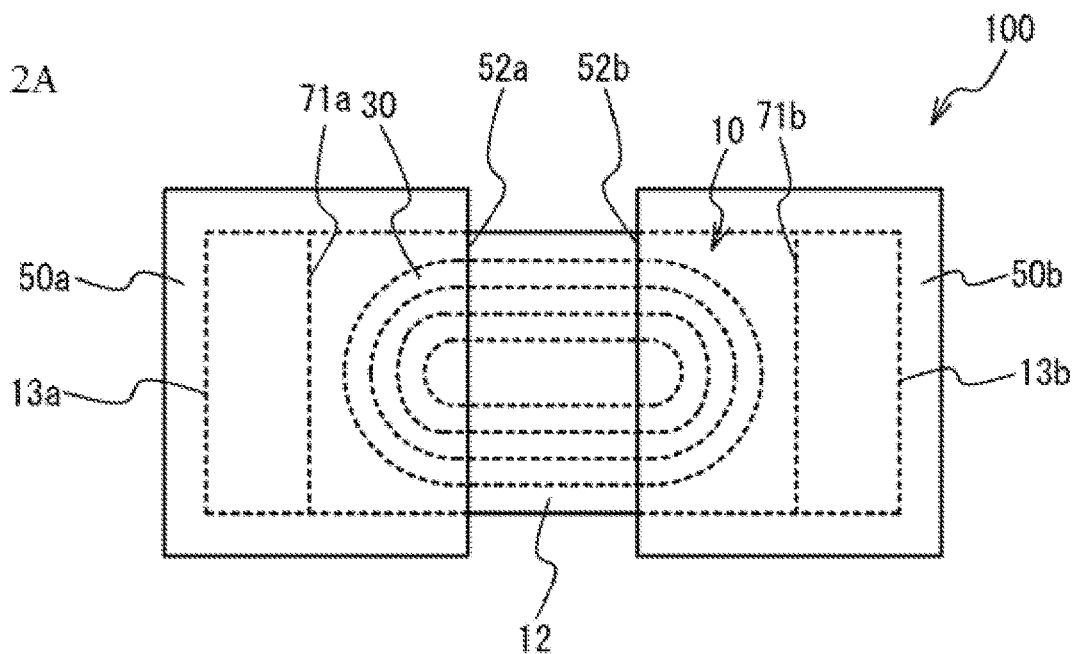
Figure 2B:
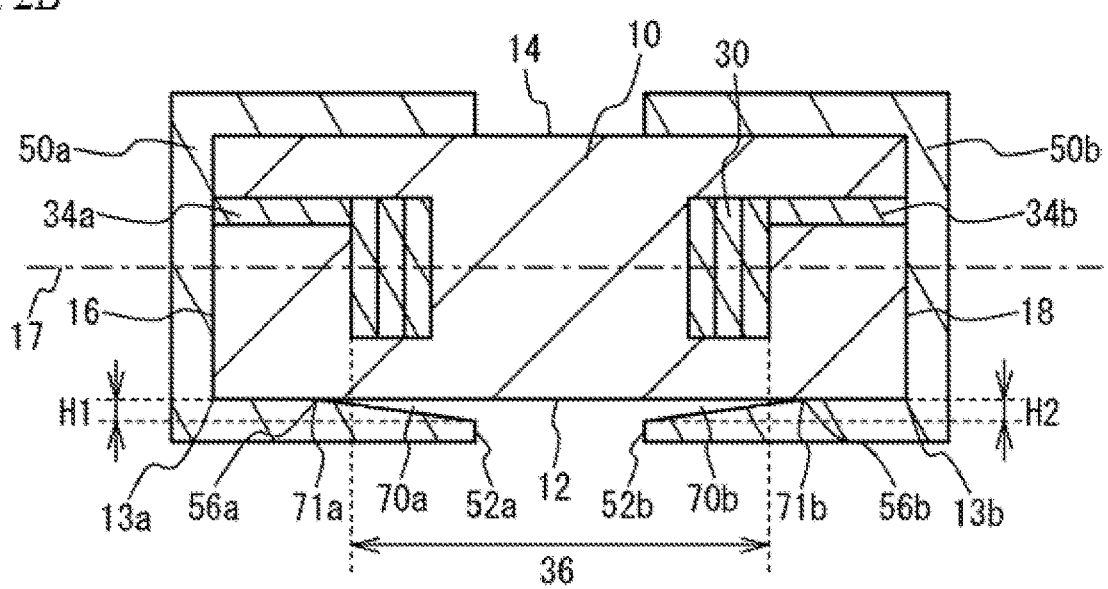
FIG. 2B is a view of cross-section A-A in FIG. 1A.
Figure 3A:
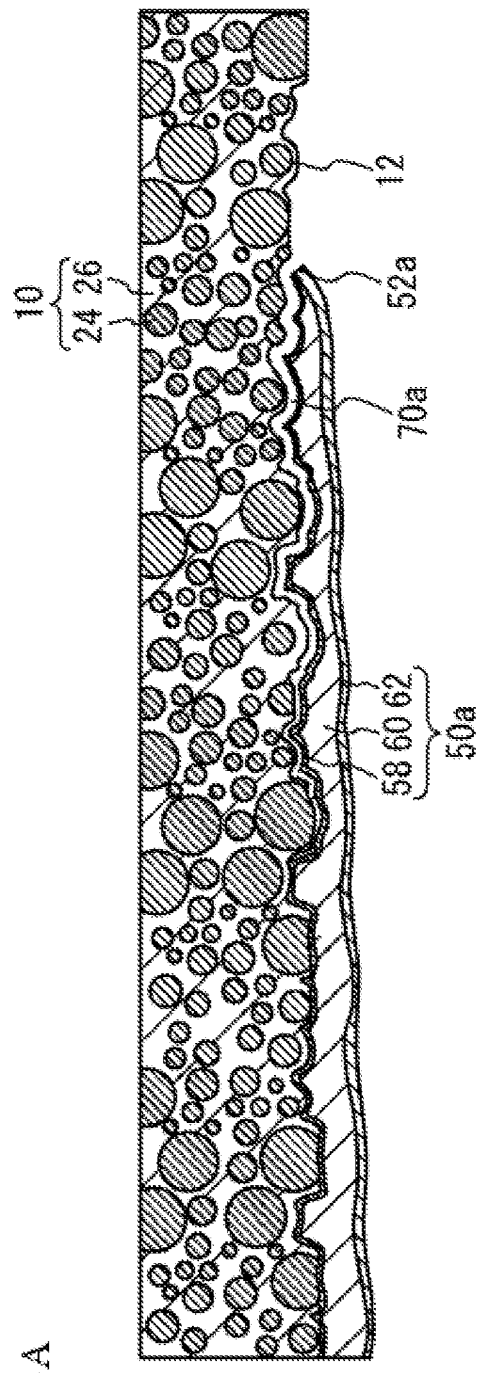
FIGS. 3A and 3B are each an enlarged cross-sectional view around a tip part of an external electrode.
Figure 3B:
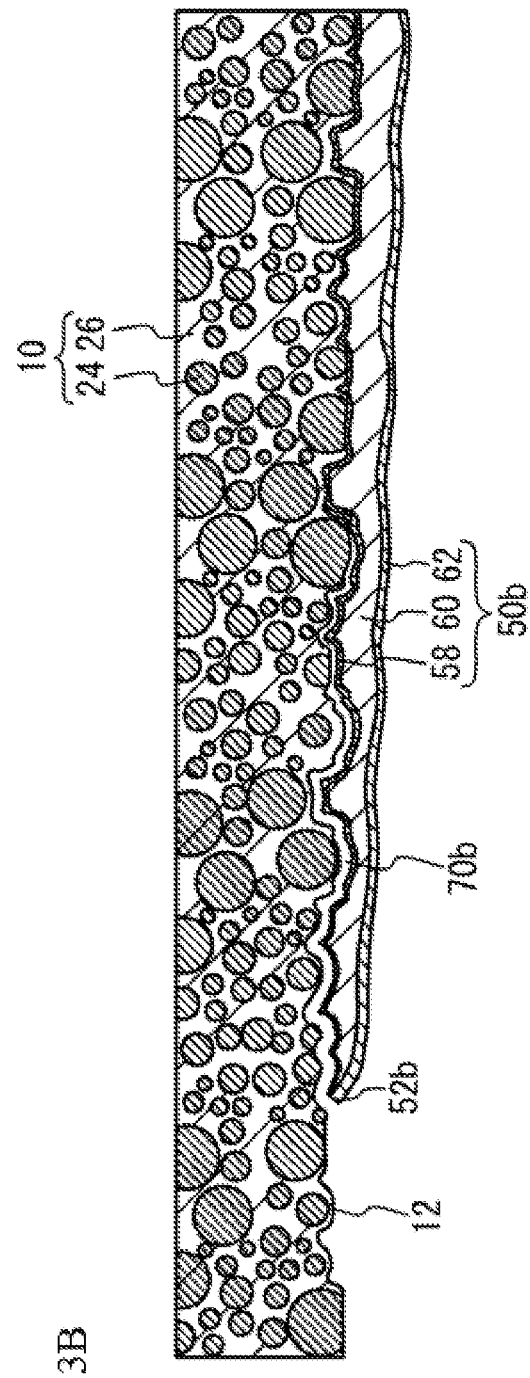

FIG. 1A is a perspective view of the coil component, while FIG. 1B is a perspective view of the element body part, pertaining to Example 1. FIG. 2A is a bottom view of the coil component pertaining to Example 1, while FIG. 2B is a view of cross-section A-A in FIG. 1A. FIGS. 3A and 3B are each an enlarged cross-sectional view around a tip part of an external electrode. As shown in FIGS. 1A, 1B, 2A, 2B, 3A, and 3B, the coil component 100 in Example 1 comprises an element body part 10, a coil 30 built into the element body part 10, lead conductors 34a, 34b led out from the coil 30, and external electrodes 50a, 50b connected to the lead conductors 34a, 34b.

The element body part 10 is shaped as a rectangular solid having a bottom face 12, a top face 14, a pair of end faces 16, 18, and a pair of side faces 20, 22. The bottom face 12 is a mounting face, while the top face 14 is a face opposite the bottom face 12. The end faces 16, 18 are faces connected to the short sides of the bottom face 12 and top face 14, while the side faces 20, 22 are faces connected to the long sides of the bottom face 12 and top face 14. It should be noted that the element body part 10 need not have a perfect rectangular solid shape; instead, it may have a roughly rectangular solid shape such as one whose apexes are rounded, one whose ridges (boundaries of faces) are rounded, or one whose faces are curved, for example.

The element body part 10 is formed by materials that include a magnetic material, being constituted by magnetic metal grains 24 and a resin 26, for example. For the magnetic metal grains 24, FeSiCrBC-based magnetic metal grains are used, for example. Also, for the magnetic metal grains 24, grains of different grain sizes, such as FeSiCrBC and Fe grains, may be used. For the resin 26, an epoxy resin or other insulating resin is used, for example. Also, for the resin 26, a polyimide resin, phenol resin, or other thermosetting resin may be used, or a polyethylene resin, polyamide resin, or other thermoplastic resin may be used. It should be noted that the element body part 10 may be formed by a ferrite material or magnetic metal material.

The coil 30 is formed by a conductor. The conductor may be a rectangular wire whose cross-section has a rectangular shape, or a round wire whose cross-section has a circular shape. The metal wire constituting the conductor has its surface covered with an insulating layer. The material for the metal wire may be copper, silver, palladium, or silver-palladium alloy, among others. Examples of the material for the insulating layer include polyester imide, polyamide, and the like. The coil 30 may be produced by alpha-winding, edge-wise-winding, or otherwise winding a conductive wire with an insulating layer, or it may be a plated flat coil. Additionally, it may be a straight or meandering wire which is not wound.

The coil 30 is built or embedded into the element body part 10. The lead conductor 34a is led out from the coil 30 toward the end face 16 of the element body part 10. The end of the lead conductor 34a is exposed on the outside of the element body part 10 on the end face 16 of the element body part 10. The lead conductor 34*b* is led out from the coil 30 toward the end face 18 of the element body part 10. The end of the lead conductor 34*b* is exposed on the outside of the element body part 10 on the end face 18 of the element body part 10. The conductors used for the lead conductor 34*a* and lead conductor 34*b* may be of a type identical to, or different from, the conductor used for the coil 30.

The external electrodes 50*a*, 50*b* are external terminals used for surface mounting. The external electrode 50*a* is provided on the bottom face 12, at a position closer to the side edge 13*a* of the bottom face 12, extends from the bottom face 12, via the end face 16 that connects to the bottom face 12 along the side edge 13*a* of the bottom face 12, to the top face 14, and partially covers the side faces 20, 22, of the element body part 10. The external electrode 50*b* is provided on the bottom face 12, at a position closer to the side edge 13*b* opposite the side edge 13*a* on the bottom face 12, extends from the bottom face 12, via the end face 18 that connects to the bottom face 12 along the side edge 13*b* of the bottom face 12, to the top face 14, and partially covers the side faces 20, 22, of the element body part 10. In other words, the external electrodes 50*a*, 50*b* are each a five-faced electrode extending to five faces of the element body part 10.

It is on the end face 16 of the element body part 10 where the end of the lead conductor 34*a* is exposed on the outside of the element body part 10, which means that the external electrode 50*a* is connected to the lead conductor 34*a* on the end face 16 of the element body part 10. It is on the end face 18 of the element body part 10 where the end of the lead conductor 34*b* is exposed on the outside of the element body part 10, which means that the external electrode 50*b* is connected to the lead conductor 34*b* on the end face 18 of the element body part 10.

The external electrodes 50*a*, 50*b* are each a metal film produced by stacking a first layer 58, a second layer 60, and a third layer 62, in this order, from the element body part 10 side. The first layer 58 is formed by copper, aluminum, nickel, silver, platinum, palladium, or other metal material, or an alloyed metal material containing the foregoing, for example. The second layer 60 is formed by silver or a conductive resin containing silver, for example. The third layer 62 is a nickel- and/or tin-plated layer, for example.

The external electrodes 50*a*, 50*b* have tip parts 52*a*, 52*b* that face each other on the bottom face 12 of the element body part 10. Formed on the bottom face 12 of the element body part 10, between the element body part 10 and the external electrode 50*a*, is a void 70*a* that extends from the tip part 52*a* of the external electrode 50*a*. The void 70*a* is open on the tip part 52*a* side of the external electrode 50*a*. Accordingly, the joining length between the bottom face 12 of the element body part 10 and the external electrode 50*a* is shorter than the length of the part of the external electrode 50*a* positioned on the bottom face 12 of the element body part 10, in the direction intersecting the side edges 13*a*, 13*b* of the bottom face 12 of the element body part 10. Similarly, formed on the bottom face 12 of the element body part 10, between the element body part 10 and the external electrode 50*b*, is a void 70*b* that extends from the tip part 52*b* of the external electrode 50*b*. The void 70*b* is open on the tip part 52*b* side of the external electrode 50*b*. Accordingly, the joining length between the bottom face 12 of the element body part 10 and the external electrode 50*b* is shorter than the length of the part of the external electrode 50*b* positioned on the bottom face 12 of the element body part 10, in the direction intersecting the side edges 13*a*, 13*b* of the bottom face 12 of the element body part 10.

The surface of the element body part 10 is rugged or uneven due to the magnetic metal grains 24 constituting the element body part 10. The voids 70*a*, 70*b* are formed in a manner undulating up and down like waves along the dips and projections formed on the bottom face 12 of the element body part 10. The maximum height H1 of the void 70*a*, and the maximum height H2 of the void 70*b*, are 10 μm or smaller, for example. Also, the end 71*a* of the void 70*a* away from the tip part 52*a* of the external electrode 50*a* is positioned closer to the side edge 13*a* of the bottom face 12 of the element body part 10, than is the projected area 36 obtained by projecting the coil 30 onto the bottom face 12 of the element body part 10. Similarly, the end 71*b* of the void 70*b* away from the tip part 52*b* of the external electrode 50*b* is positioned closer to the side edge 13*b* of the bottom face 12 of the element body part 10, than is the projected area 36. In other words, the parts of the external electrodes 50*a*, 50*b* joining the bottom face 12 of the element body part 10 are positioned on the outer side of the coil 30, and not overlapping the coil 30.

Next, a method for manufacturing the coil component 100 pertaining to Example 1 is explained. First, a conductive wire with an insulating layer is wound to form a coil 30, after which both ends of this conductive wire are led out from the coil 30 to form lead conductors 34*a*, 34*b*. Next, an element body part 10 in which the coil 30 and lead conductors 34*a*, 34*b* are buried, is formed using the powder compacting method, for example. At this time, the end of the lead conductor 34*a* is exposed on the end face 16 of the element body part 10, while the end of the lead conductor 34*b* is exposed on the end face 18 of the element body part 10. Next, the insulating layer mechanically stripped and removed from the ends of the lead conductors 34*a*, 34*b*, after which the resin component, etc., are removed, by means of laser irradiation, blasting, polishing, etc., from the areas on the surface of the element body part 10 where external electrodes 50*a*, 50*b* will be formed.

Next, a sacrificial layer is formed in the areas on the surface of the element body part 10 where voids 70*a*, 70*b* will be formed. For the sacrificial layer, an organic film soluble in organic solvents, such as an acrylic resin film, may be used. It should be noted that, for the sacrificial layer, a light-sensitive photoresist may be used. The thickness of the sacrificial layer is 10 μm or smaller, for example. Next, a metal material is sputtered to form a first layer 58 in the areas on the surface of the element body part 10 where external electrodes 50*a*, 50*b* will be formed, after which a second layer 60 covering the outer side thereof is formed. The second layer 60 may be formed by the sputtering method, or it may be formed by applying a conductive paste and then curing the resin in the paste. After the second layer 60 has been formed, a third layer 62 is formed on the outer side of the second layer 60 using any suitable plating method. This way, external electrodes 50*a*, 50*b*, each being a multi-layer metal film constituted by the first layer 58, second layer 60, and third layer 62, are formed. At this time, the part of the external electrode 50*a* having a specified length from the tip part 52*a* covers the sacrificial layer, while the part of the external electrode 50*b* having a specified length from the tip part 52*b* covers the sacrificial layer.

Next, the sacrificial layer is removed using an organic solvent, etc. It should be noted that ultrasound waves may be applied to promote the dissolution. This way, a void 70*a* extending from the tip part 52*a* of the external electrode 50*a* is formed between the element body part 10 and the external electrode 50*a*, and a void 70*b* extending from the tip part 52*b* of the external electrode 50*b* is formed between the element body part 10 and the external electrode 50b. The coil component 100 in Example 1 has thus been formed.

Figure 4:
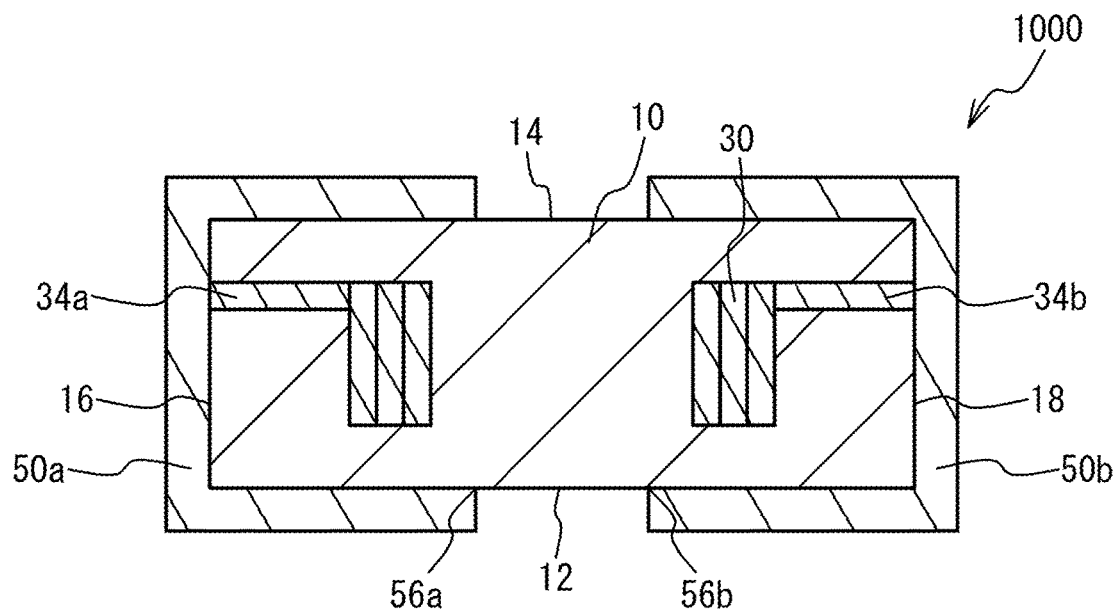
FIG. 4 is a cross-sectional view of the coil component pertaining to Comparative Example 1.

Now, before explaining the effects of the coil component 100 in Example 1, a coil component in a comparative example is explained. FIG. 4 is a cross-sectional view of the coil component pertaining to Comparative Example 1. As shown in FIG. 4, the coil component 1000 in Comparative Example 1 has no void formed between the external electrode 50a and the element body part 10, or between the external electrode 50b and the element body part 10, on the bottom face 12 of the element body part 10. The remaining constitutions are the same as those in Example 1 and therefore not explained.

Figure 5:
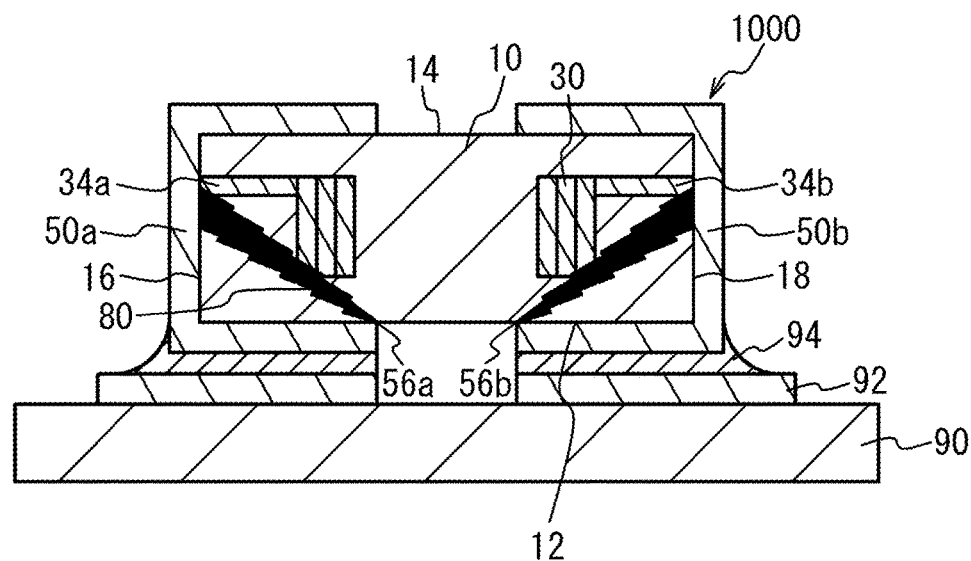
FIG. 5 is a drawing explaining the problems encountered by the coil component in Comparative Example 1.

FIG. 5 is a drawing explaining the problems encountered by the coil component in Comparative Example 1. As shown in FIG. 5, the external electrodes 50a, 50b of the coil component 1000 in Comparative Example 1 are joined by the solder 94 to the terminal electrodes 92 of the circuit board 90, and thus the coil component 1000 is mounted on the circuit board 90. In this case, the circuit board 90 may deflect due to temperature shift, etc. If the circuit board 90 deflects, stress is applied to the external electrodes 50a, 50b that are joined to the terminal electrodes 92 of the circuit board 90. This stress tends to concentrate on, within the joining part of the external electrode 50a with the bottom face 12 of the element body part 10, the joining part 56a on the innermost side, as well as on, within the joining part of the external electrode 50b with the bottom face 12 of the element body part 10, the joining part 56b on the innermost side. The stress applied to the joining part 56a of the external electrode 50a and to the joining part 56b of the external electrode 50b, becomes greater as the spacing between the joining part 56a of the external electrode 50a and the joining part 56b of the external electrode 50b becomes smaller. As the stress concentrates on the joining part 56a of the external electrode 50a and on the joining part 56b of the external electrode 50b, cracks 80 may generate in the element body part 10, originating from the joining part 56a of the external electrode 50a and from the joining part 56b of the external electrode 50b.

According to Example 1, on the other hand, as shown in FIGS. 2B, 3A and 3B, the voids 70a, 70b extending from the tip part 52a of the external electrode 50a and from the tip part 52b of the external electrode 50b, respectively, are formed between the bottom face 12 of the element body part 10 and the external electrodes 50a, 50b. This way, the spacing between the joining part 56a on the innermost side within the joining part of the external electrode 50a with the bottom face 12 of the element body part 10, and the joining part 56b on the innermost side within the joining part of the external electrode 50b with the bottom face 12 of the element body part 10, can be made greater. Accordingly, the stress applied to the joining part 56a of the external electrode 50a and to the joining part 56b of the external electrode 50b can be made smaller, and consequently generation of cracks in the element body part 10 can be prevented. In addition, there is no need to change the lengths of the external electrodes 50a, 50b themselves on the bottom face 12 of the element body part 10, and this prevents their joining strength with the circuit board from dropping.

As shown in FIG. 2B, preferably the lead conductor 34a is led out from the coil 30 toward the end face 16 of the element body part 10, and connected, on the end face 16 of the element body part 10, to the external electrode 50a provided in a manner extending from the bottom face 12, to the end face 16, of the element body part 10. The lead conductor 34b is led out from the coil 30 toward the end face 18 of the element body part 10, and connected to the external electrode 50b provided in a manner extending from the bottom face 12, to the end face 18, of the element body part 10. This way, the length of the void 70a formed in a manner extending from the tip part 52a of the external electrode 50a, and the length of the void 70b formed in a manner extending from the tip part 52b of the external electrode 50b, can be extended. As a result, the spacing between the joining part 56a of the external electrode 50a and the joining part 56b of the external electrode 50b can be increased, which in turn effectively prevents generation of cracks in the element body part 10.

As shown in FIG. 2B, preferably the end 71a of the void 70a away from the tip part 52a of the external electrode 50a is positioned closer to the side edge 13a of the bottom face 12 of the element body part 10, than is the projected area 36, obtained by projecting the coil 30 onto the bottom face 12 of the element body part 10. The end 71b of the void 70b away from the tip part 52b of the external electrode 50b is positioned closer to the side edge 13b of the bottom face 12 of the element body part 10, than is the projected area 36. This way, the joining part 56a of the external electrode 50a, and the joining part 56b of the external electrode 50b, can be positioned on the outer side of the coil 30. This means that, even if cracks generate in the element body part 10, originating from the joining part 56a of the external electrode 50a and from the joining part 56b of the external electrode 50b, these cracks are prevented from affecting the coil 30 because they are formed on the outer side of the coil 30. As a result, deterioration of the electrical properties can be prevented.

As shown in FIG. 2B, preferably the lead conductors 34a, 34b are provided at positions closer to the top face 14, than is the center 17 between the bottom face 12 and the top face 14, of the element body part 10. This means that, even if cracks generate in the element body part 10, originating from the joining part 56a of the external electrode 50a and from the joining part 56b of the external electrode 50b, these cracks are prevented from affecting the lead conductors 34a, 34b, and consequently deterioration of the electrical properties can be prevented.

As shown in FIGS. 3A and 3B, preferably the voids 70a, 70b are formed in a manner undulating along the dips and projections formed on the bottom face 12 of the element body part 10 constituted by the magnetic metal grains 24 and resin 26 (the shape of the inner surface of the external electrode is substantially matched with the shape of the uneven surface of the bottom face). This way, the (average) heights of the voids 70a, 70b can be kept low as compared with a configuration where the inner surface of the electrode is flat. If the voids 70a, 70b are closed by a solder used for mounting the coil component 100 on a circuit board, the voids may pop by heat. Because the heights of the voids 70a, 70b are kept low, however, closing of the voids 70a, 70b by the solder is substantially prevented due to the surface tension of the solder. As a result, popping of the voids can be prevented. Also, in the interest of preventing popping of the voids caused by clogging of the voids 70a, 70b, the maximum height H1 of the void 70a, and the maximum height H2 of the void 70b, are preferably 10 μm or smaller, or more preferably 8 μm or smaller, or yet more preferably 6 μm or smaller so as to substantially prevent closing of the voids due to the surface tension of the solder.

It should be noted that Example 1 presents an example where the void 70a is formed between the bottom face 12 of the element body part 10 and the external electrode 50a, and the void 70b is formed between the bottom face 12 of the element body part 10 and the external electrode 50b. However, this is not the only case, and it suffices that a void is formed at least between the bottom face 12 of the element body part 10 and the external electrode 50a or between the bottom face 12 of the element body part and the external electrode 50b. In this case, too, the spacing between the joining part 56a of the external electrode 50a and the joining part 56b of the external electrode 50b can be increased, and generation of cracks in the element body part 10 can be prevented as a result.

The voids 70a, 70b can be confirmed by, for example, filling the coil 30 with a resin and polishing its cross-section, and then observing the cross-section using an optical microscope, or conducting a combination of electron microscopy using a scanning electron microscope (SEM) and energy dispersive X-ray spectrometry (EDX). By filling the coil with a resin of a type different from the resin 26, or by using a filler that contains an elemental component not found in the coil 30, the voids 70a, 70b can be differentiated with ease. So that the voids 70a, 70b can be observed in a reliable manner, any ingenious idea may be used as deemed necessary, such as using a highly flowable resin that can easily enter the voids 70a, 70b, using a filler-free resin or resin containing a small-grain-size filler, performing vacuum impregnation when the resin is filled, or any other suitable method.

EXAMPLE 2

Figure 6A:
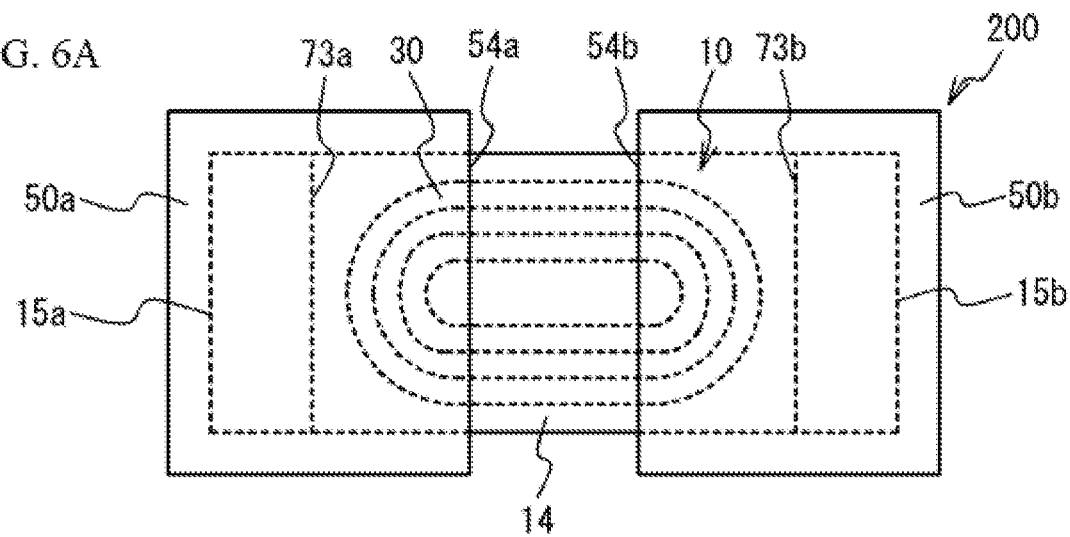
FIG. 6A is a top view.
Figure 6B:
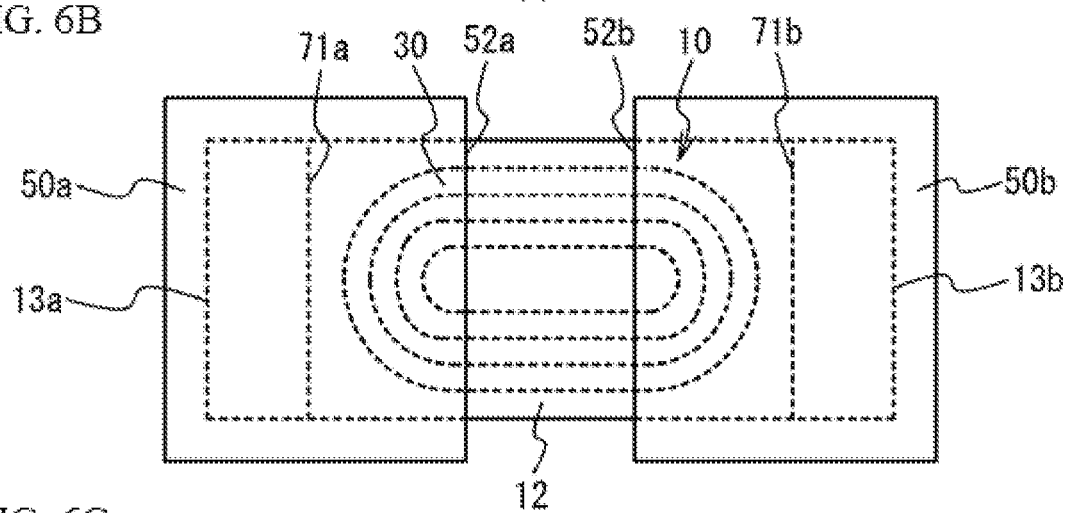
FIG. 6B is a bottom view.
Figure 6C:
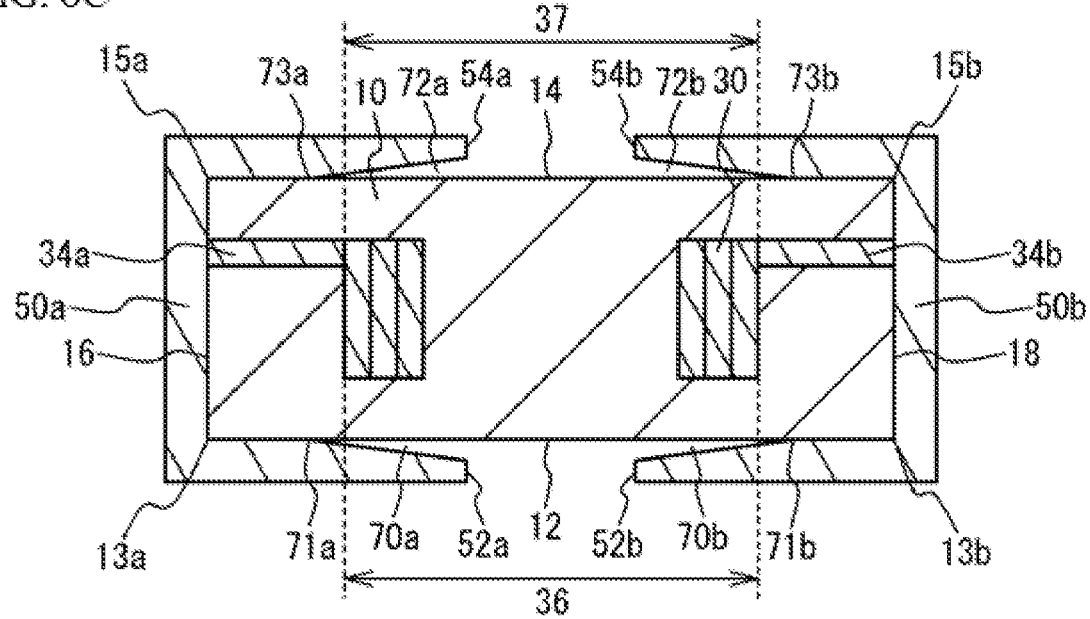
FIG. 6C is a cross-sectional view, of the coil component pertaining to Example 2.

FIG. 6A is a top view, FIG. 6B is a bottom view, and FIG. 6C is a cross-sectional view, of the coil component pertaining to Example 2. As shown in FIGS. 6A to 6C, the coil component 200 in Example 2 has a void 72a formed on the top face 14 of the element body part 10 between the element body part 10 and the external electrode 50a, in a manner extending from the tip part 54a of the external electrode 50a. Similarly, a void 72b is formed on the top face 14 of the element body part 10 between the element body part 10 and the external electrode 50b, in a manner extending from the tip part 54b of the external electrode 50b. In other words, the void 72a is open on the tip part 54a side of the external electrode 50a, while the void 72b is open on the tip part 54b side of the external electrode 50b. The tip part 54a of the external electrode 50a, and the tip part 54b of the external electrode 50b, are where the external electrodes 50a, 50b face each other on the top face 14 of the element body part 10.

The end 73a of the void 72a away from the tip part 54a of the external electrode 50a is positioned closer to the side edge 15a of the top face 14 of the element body part 10, than is a projected area 37 obtained by projecting the coil 30 onto the top face 14 of the element body part 10. The end 73b of the void 72b away from the tip part 54b of the external electrode 50b is positioned closer to the side edge 15b of the top face 14 of the element body part 10, than is the projected area 37. The remaining constitutions are the same as those in Example 1 and therefore not explained.

According to Example 2, voids 70a, 70b are formed between the bottom face 12 of the element body part 10 and the external electrodes 50a, 50b, in a manner extending from the tip part 52a of the external electrode 50a and from the tip part 52b of the external electrode 50b, respectively. In addition to these, the voids 72a, 72b are formed between the top face 14 of the element body part 10 and the external electrodes 50a, 50b, in a manner extending from the tip part 54a of the external electrode 50a and from the tip part 54b of the external electrode 50b, respectively. This way, generation of cracks in the element body part 10 can be prevented, not only when the coil component 100 is mounted on a circuit board by its bottom face 12, but also when the coil component 100 is mounted on a circuit board by its top face 14.

EXAMPLE 3

Figure 7:
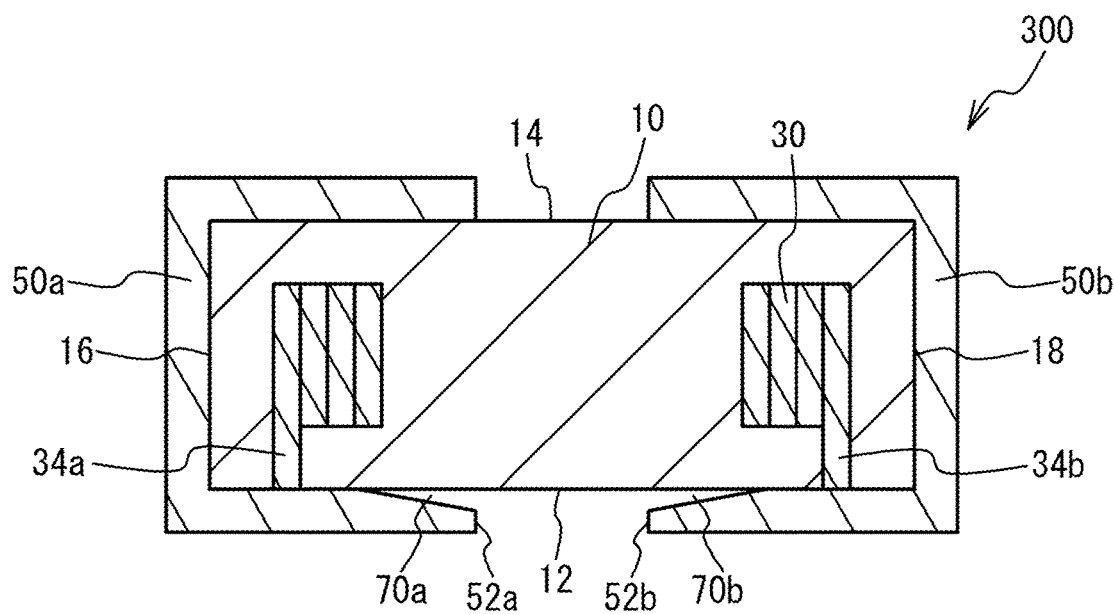
FIG. 7 is a cross-sectional view of the coil component pertaining to Example 3.

FIG. 7 is a cross-sectional view of the coil component pertaining to Example 3. As shown in FIG. 7, the coil component 300 in Example 3 has its lead conductors 34a, 34b led out from the coil 30 toward the bottom face 12 of the element body part 10, and connected to the external electrodes 50a, 50b on the bottom face 12 of the element body part 10. The remaining constitutions are the same as those in Example 1 and therefore not explained.

Examples 1 and 2 present examples where the lead conductor 34a is led out from the coil 30 toward the end face 16 of the element body part 10, while the lead conductor 34b is led out from the coil 30 toward the end face 18 of the element body part 10. However, this is not the only case and, as shown in Example 3, the lead conductors 34a, 34b may be led out from the coil 30 toward the bottom face 12 of the element body part 10. In this case, preferably voids 70a, 70b are not formed in the part where the lead conductor 34a is exposed on the bottom face 12 of the element body part 10 and connected to the external electrode 50a, and the part where the lead conductor 34b is exposed on the bottom face 12 of the element body part 10 and connected to the external electrode 50b.

EXAMPLE 4

Figure 8A:
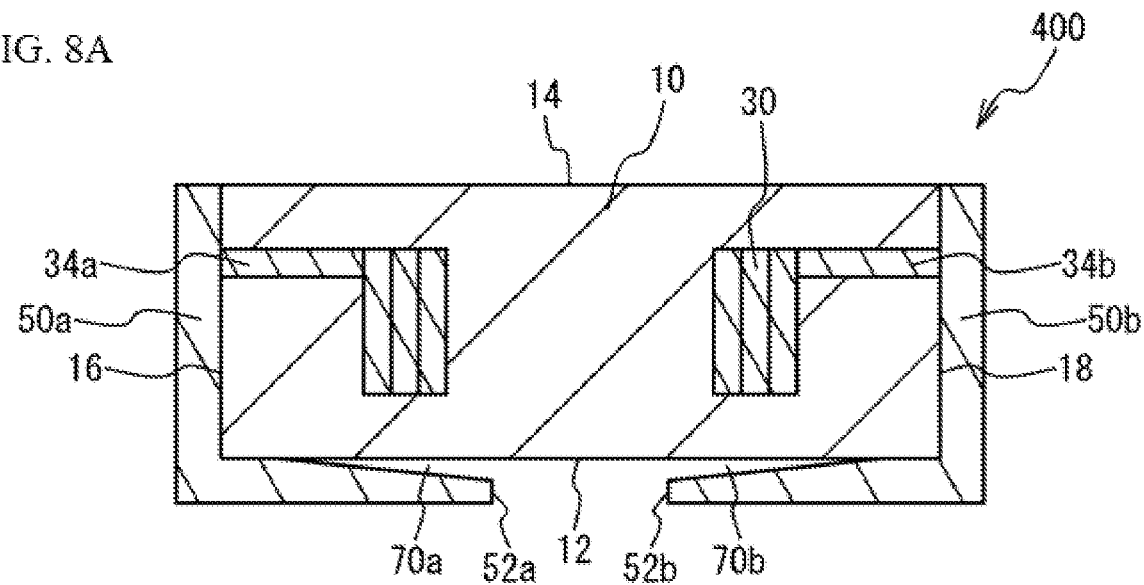
Figure 8B:
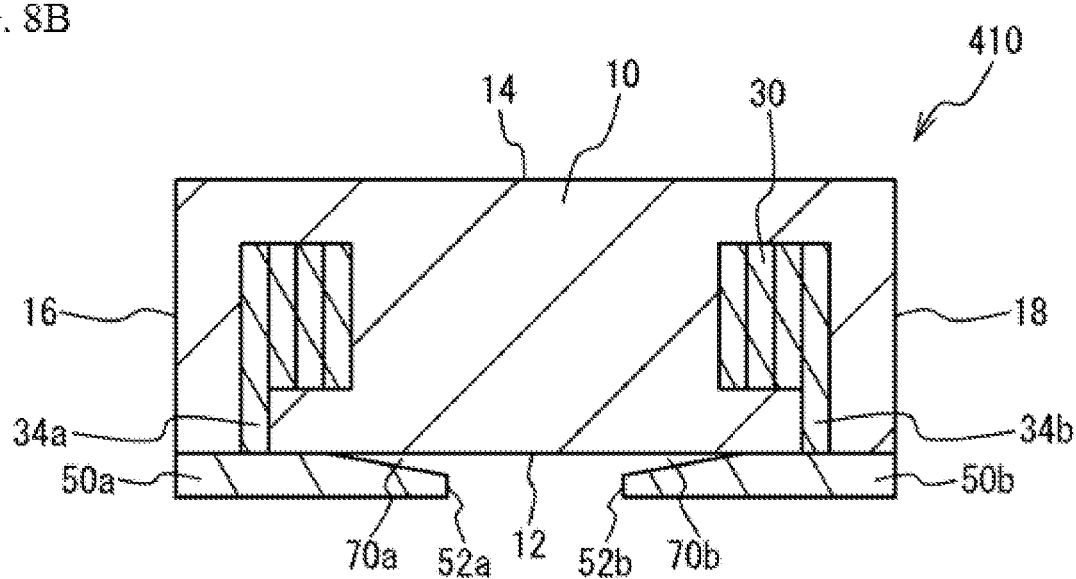
FIG. 8B is a cross-sectional view of the coil component pertaining to Variation Example 1 of Example 4.

FIG. 8A is a cross-sectional view of the coil component pertaining to Example 4, while FIG. 8B is a cross-sectional view of the coil component pertaining to Variation Example 1 of Example 4. As shown in FIG. 8A, the coil component 400 in Example 4 has its external electrode 50a provided in a manner extending from the bottom face 12, to the end face 16, of the element body part 10, and its external electrode 50b provided in a manner extending from the bottom face 12, to the end face 18, of the element body part 10. The external electrodes 50a, 50b are not provided on the top face 14 and side faces 20, 22 of the element body part 10. The remaining constitutions are the same as those in Example 1 and therefore not explained. As shown in FIG. 8B, the coil component 410 in Variation Example 1 of Example 4 has its external electrodes 50a, 50b provided only on the bottom face 12, among all surfaces, of the element body part 10. The remaining constitutions are the same as those in Example 3 and therefore not explained.

Examples 1 to 3 present examples where the external electrodes 50a, 50b are five-faced electrodes; however, the external electrodes 50a, 50b may be two-faced electrodes as shown in Example 4, or the external electrodes 50a, 50b may be one-faced electrodes as shown in Variation Example 1 of Example 4. Additionally, they may be three-faced electrodes; the external electrode 50a may be provided in a manner extending from the bottom face 12, via the end face 16, to the top face 14, of the element body part 10, while the external electrode 50b may be provided in a manner extending from the bottom face 12, via the end face 18, to the top face 14, of the element body part 10.

EXAMPLE 5

Figure 9:
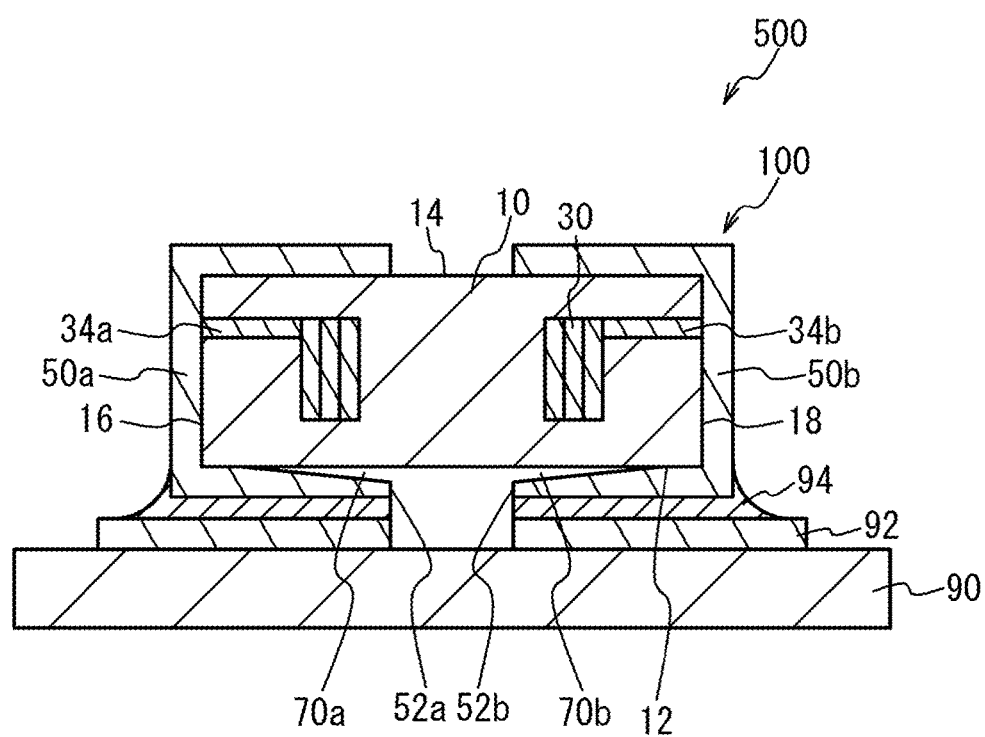
FIG. 9 is a cross-sectional view of the electronic device pertaining to Example 5.

FIG. 9 is a cross-sectional view of the electronic device pertaining to Example 5. As shown in FIG. 9, the electronic device 500 in Example 5 comprises a circuit board 90 and the coil component 100 in Example 1 mounted on the circuit board 90. The coil component 100 is mounted on the circuit board 90 as a result of its external electrodes 50a, 50b joined to the terminal electrodes 92 on the circuit board 90 by a solder 94.

According to the electronic device 500 in Example 5, the coil component 100 is mounted on the circuit board 90 as a result of the external electrodes 50a, 50b of the coil component 100 joined to the terminal electrodes 92 on the circuit board 90. This way, an electronic device 500 comprising a coil component 100 designed to prevent generation of cracks therein, can be obtained.

It should be noted that, while Example 5 presents an example where the coil component 100 in Example 1 is mounted on the circuit board 90, any of the coil components in Example 2 to Variation Example 1 of Example 4 may be mounted instead.

The foregoing described the examples of the present invention in detail; however, the present invention is not limited to these specific examples, and various modifications and changes may be added to the extent that they do not affect the key points of the present invention described in "What Is Claimed Is."

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2018-015920, filed Jan. 31, 2018, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A coil component, comprising:
    an element body part which is formed by materials that include a magnetic material;
    a coil which is built into the element body part and formed by a conductor;
    a first external electrode which is provided at least on a first face, among all surfaces, of the element body part at a position closer to a first side edge of the first face, than is a center between the first side edge and a second side edge of the first face opposite the first side edge, and which is electrically connected to the coil; and
    a second external electrode which is provided at least on the first face, among all surfaces, of the element body part at a position closer to the second side edge of the first face, than is the center between the first side edge and a second side edge, and which is electrically connected to the coil;
    wherein,
    the first external electrode has a first tip part facing the second external electrode on the first face of the element body part;
    the second external electrode has a second tip part facing the first external electrode on the first face of the element body part;
    a first void is present between the first external electrode and the first face of the element body part in a manner having an opening continuously extending along the first tip part of the first external electrode, and continuously extending from the opening at the first tip part in a direction toward the first side edge of the first face in a state where the coil component is not mounted on a circuit board; and
    the first tip part intersects a projected area defined by projecting the coil onto the first face of the element body as viewed in a direction perpendicular to the first face.

2. The coil component according to claim 1, wherein a second void is present between the second external electrode and the first face of the element body part, in a manner to extend along the second tip part of the second external electrode and continuously to extend from the second tip part in a direction toward the second side edge of the first face.

3. The coil component according to claim 1, wherein:
    the coil has a first lead conductor and a second lead conductor, both led out therefrom;
    the first external electrode is formed in a manner to extend from the first face, to a second face that connects to the first face along the first side edge of the first face, of the element body part;
    the second external electrode is formed in a manner to extend from the first face, to a third face that connects to the first face along the second side edge of the first face, of the element body part;
    the first lead conductor is led out from the coil toward the second face of the element body part and connected to the first external electrode on the second face of the element body part; and
    the second lead conductor is led out from the coil toward the third face of the element body part and connected to the second external electrode on the third face of the element body part.

4. The coil component according to claim 3, wherein the first lead conductor, and the second lead conductor, are each formed at a position closer to a fourth face, than is the center between the first face and the fourth face opposite the first face, of the element body part.

5. The coil component according to claim 1, wherein an end of the first void opposite the first tip part of the first external electrode, is positioned closer to the first side edge of the first face of the element body part than is a projected area obtained by projecting the coil onto the first face of the element body part.

6. The coil component according to claim 1, wherein:
    the first external electrode is formed in a manner to extend from the first face, via a second face that connects to the first face along the first side edge of the first face, to a fourth face opposite the first face, of the element body part;

the second external electrode is formed in a manner to extend from the first face, via a third face that connects to the first face along the second side edge of the first face, to the fourth face opposite the first face, of the element body part;

the first external electrode has a third tip part facing the second external electrode on the fourth face of the element body part;

the second external electrode has a fourth tip part facing the first external electrode on the fourth face of the element body part; and a third void is present between the first external electrode and the fourth face of the element body part, in a manner to extend from the third tip part of the first external electrode.

7. The coil component according to claim 1, wherein a maximum height of the first void, which is a maximum thickness of a gap between the first external electrode and the first face of the element body part, is 10 µm or smaller.

8. The coil component according to claim 1, wherein the first void continuously extends over an entire width of the first face in parallel to the first side edge.

9. The coil component according to claim 2, wherein the first void continuously extends over an entire width of the first face in parallel to the first side edge.

10. An electronic device comprising:

the coil component according to claim 1;

a circuit board on which the coil component is mounted; wherein, the first external electrode, and the second external electrode, of the coil component, are each connected to a terminal electrode on the circuit board.

* * * * *